(12) United States Patent
Tong et al.

(10) Patent No.: US 6,732,912 B2
(45) Date of Patent: May 11, 2004

(54) SOLDER BALL ATTACHING PROCESS

(75) Inventors: Ho-Ming Tong, Taipei (TW);
Chun-Chi Lee, Kaohsiung (TW);
Jen-Kuang Fang, Pingtung (TW);
Min-Lung Huang, Kaohsiung (TW);
Jau-Shoung Chen, Hsinchu (TW);
Ching-Huei Su, Kaohsiung (TW);
Chao-Fu Weng, Tainan (TW);
Yung-Chi Lee, Kaohsiung (TW);
Yu-Chen Chou, Kaohsiung (TW);
Tsung-Hua Wu, Kaohsiung Hsien
(TW); Su Tao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/248,225

(22) Filed: Dec. 30, 2002

(65) Prior Publication Data
US 2003/0164395 A1 Sep. 4, 2003

(30) Foreign Application Priority Data
Mar. 1, 2002 (TW) ......................... 91103734 A

(51) Int. Cl.⁷ ............................. B23K 31/02
(52) U.S. Cl. ...................................... 228/246
(58) Field of Search .................. 228/123.1, 246, 228/245, 180.21, 180.22; 438/613–617; 257/737, 738; 361/767, 768; 29/840–843

(56) References Cited

U.S. PATENT DOCUMENTS

| | | | | |
|---|---|---|---|---|
| 5,655,704 A | * | 8/1997 | Sakemi et al. | 228/246 |
| 5,839,191 A | * | 11/1998 | Economy et al. | 29/843 |
| 6,541,364 B2 | * | 4/2003 | Mukuno et al. | 438/612 |

* cited by examiner

Primary Examiner—Kiley Stoner
Assistant Examiner—Jonathan Johnson
(74) Attorney, Agent, or Firm—Jiang Chyun IP Office

(57) ABSTRACT

A solder ball attaching process for attaching solder balls to a wafer is provided. First, an under-ball-metallurgy layer is formed on the active surface of the wafer. Patterned masking layers are sequentially formed over the active surface of the wafer. The masking layers together form a step opening structure that exposes the under-ball-metallic layer. A solder ball is placed on the uppermost masking layer and allowed to roll so that the solder ball drops into the step opening structure by gravity. A reflow process is conducted to join the solder ball and the under-ball-metallurgy layer together. Finally, various masking layers are removed to expose the solder ball on the bonding pad of the wafer.

29 Claims, 5 Drawing Sheets

SOLDER BALL ATTACHING PROCESS

CROSS REFERENCE TO RELATED APPLICATIONS

This application claims the priority benefit of Taiwan application serial no. 91103734, filed Mar. 1, 2002.

BACKGROUND OF INVENTION

1. Field of Invention

The present invention relates to a solder ball attaching process. More particularly, the present invention relates to a process of attaching a solder ball to the bonding pad of a wafer.

2. Description of Related Art

Due to the trend for developing light and compact electronic products, the size of most integrated circuit packages continues to decrease. To reduce the size of integrated circuit (IC) packages, chip scale packages (CSP) are developed. In general, the edge length of a CSP package is roughly 1.2 times the edge length of a silicon chip or the chip/package has an area ratio of about 80% and the pitch between leads is limited to a value under 1 mm. Many types of chip scale packages are now available. However, the most common type is one having the package directly formed on the wafer known also as a wafer level chip scale package (WLCSP).

One major characteristic of a WLCSP is the fabrication of a redistribution circuit on the surface of the chip so that the bonding pads around the periphery of the chip are redistributed as an area array on top of the chip. Hence, the entire surface of the chip can be utilized for accommodating bonding pads, thereby producing a larger pitch between bonding pads to meet the larger distance of separation between contacts on a printed circuit board (PCB).

To connect the chip and the printed circuit board electrically, a solder ball is normally attached to the bonding pad corresponding to the redistribution circuit above the chip surface. Thus, the original bonding pad on the chip surface may connect electrically with the contact on the printed circuit board through the solder ball and the redistribution circuit on the chip. On the other hand, if the original bonding pad on the chip has sufficiently large distance of separation, a redistribution circuit may not be required. In this case, the solder balls may be directly attached to the bonding pads on the chip such that the original bonding pads on the chip are directly connected to the contacts on a printed circuit board via the solder balls. In the following description, the bonding pads on the chip or the wafer may refer to the original bonding pads on the chip or the bonding pad on the chip after circuit redistribution.

A conventional solder ball attaching process involves positioning a solder ball onto a corresponding bonding pad and performing a reflow process so that the solder ball is firmly attached to the bonding pad. At present, two major methods are used for positioning the solder balls, namely, the vacuum transfer method and the gravity transfer method. In the vacuum transfer method, suction on a suction head is used to pick up a solder ball from a solder ball holder and then transfer it to a corresponding bonding pad location. In the gravity transfer method, a stencil is placed over the wafer surface and then a large number of solder balls is spread out over the stencil. Through the weight of each solder ball and a rocking motion produced by a motor, the solder balls are forced into the sieve holes in the stencil and hence appropriately positioned over the bonding pads. However, a layer of flux material is smeared over the bonding pad surface to increase the bonding strength between the solder balls and the bonding pads before the solder balls are positioned and the reflow process is performed.

The equipment for positioning the solder balls using a vacuum transfer method is rather expensive. The stencil for positioning the solder ball in a gravity transfer method must be accurately aligned over the wafer. Moreover, the stencil must change for each new wafer design and the expenses for drilling a large number of sieve holes in a stencil is high. All in all, overall cost for attaching solder balls onto bonding pads is high.

SUMMARY OF INVENTION

Accordingly, one object of the present invention is to provide a solder ball attaching process for attaching a plurality of solder balls to bonding pads on a wafer. The attaching process costs much less than the conventional vacuum transfer method or the gravity transfer method. Moreover, this invention provides openings having a step structure to facilitate the trapping of solder balls and the positioning of solder balls accurately over the bonding pads within a short time.

To achieve these and other advantages and in accordance with the purpose of the invention, as embodied and broadly described herein, the invention provides a solder ball attaching process for attaching at least one solder ball onto a wafer. The wafer has an active surface, a passivation layer and at least one bonding pad. The passivation layer and the bonding pad are formed on the active surface of the wafer. The passivation layer exposes the bonding pad. The solder ball attaching process includes forming at least one under-ball-metallurgy layer over the bonding pad. Thereafter, a first masking layer is formed on the active surface of the wafer and then patterned to form at least one opening that exposes the under-ball-metallurgy layer. A second masking layer is formed over the first masking layer and then the second masking layer is patterned to form at least one second opening that exposes the under-ball metallurgy layer. The second opening, having an aperture, such as diameter, greater than the first opening, is positioned over the first opening. Thereafter, a solder ball is placed on the second masking layer and allowed to roll gently so that the solder ball drops into the second and the first opening. The lower end of the solder ball is in contact with the upper surface of the under-ball metallurgy layer. A reflow process is conducted so that the solder ball and the under-ball metallurgy layer are bonded together. Finally, the first masking layer and the second masking layer are removed.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
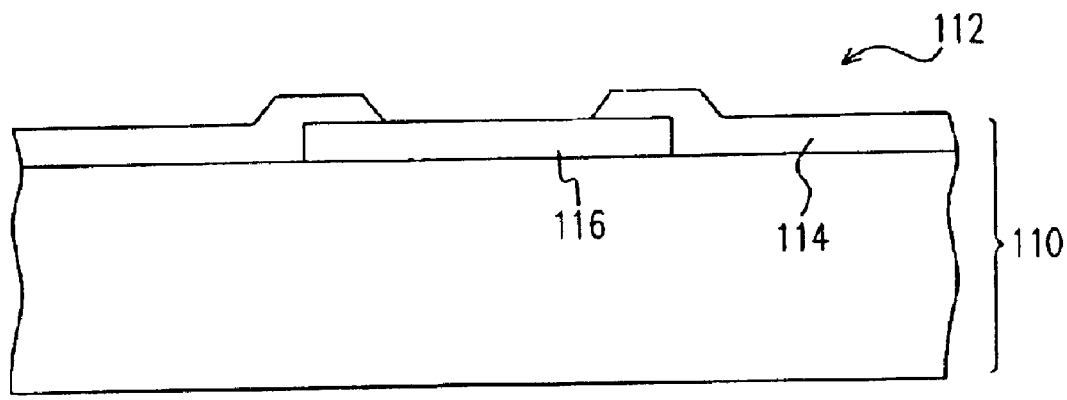
FIGS. 1A to 1H are schematic cross-sectional views showing the steps carried out in a solder ball attaching process according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1H are schematic cross-sectional views showing the steps carried out in a solder ball attaching process according to one preferred embodiment of this invention. As shown in FIG. 1A, a wafer 110 having an active surface 112, a passivation layer 114 and a plurality of bonding pads 116 (only one bonding pad is shown) is provided. The active surface 112 of the wafer 110 refers to the side of the wafer 110 having the most semiconductor devices. Both the passivation layer 114 and the bonding pads 116 are formed on the active surface 112 of the wafer 110. The passivation layer 114 has an opening that exposes the bonding pad 116.

Figure 1B:
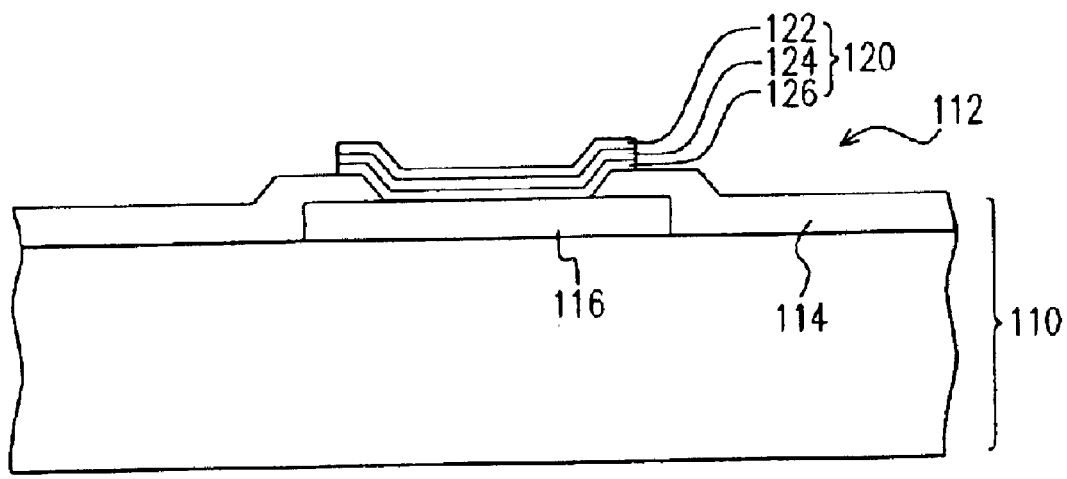

As shown in FIG. 1B, an under-ball-metallurgy (UBM) layer 120 is formed over the bonding pad 116. The under-ball-metallurgy layer 120 mainly serves as an interface between a solder ball 150 and the bonding pad 116 in FIG. 1F and hence must have good adhesive strength and wetting capacity. In general, the under-ball-metallurgy layer (120) is a composite layer of two or more metallic layers including an adhesion layer 126 for increasing bonding strength and a wetting layer 122 for increasing the wettability of the solder ball 150. In addition, since the wetting layer 122 is typically made of copper, an additional barrier layer 124 is formed between the wetting layer 122 and the adhesion layer 126 to prevent any downward diffusion of copper atoms to the bonding pad 116. Alternatively, if the adhesion layer 126 has copper-blocking capacity just like the barrier layer 124, the under-ball-metallurgy layer 120 may include the adhesion layer 126 and the wetting layer 122 only.

Figure 1C:
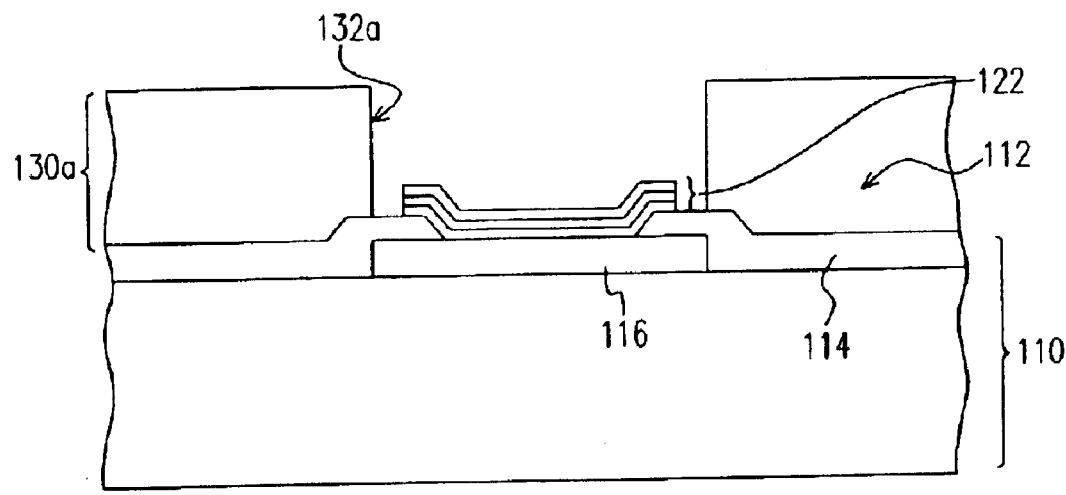

As shown in FIG. 1C, a first masking layer 130a is formed over the active surface 112 of the wafer 110. The first masking layer 130a is fabricated using a photoresist material such as photosensitive dry film or liquid photoresist. If the first masking layer 130a is formed from a photosensitive dry film, a lamination process is conducted to press a photosensitive dry film onto the active surface 112 of the wafer 110. On the other hand, if the first masking layer 130a is formed from a layer of liquid photoresist, liquid photoresist is spin-coated onto the active surface 112 of the wafer 110. The first masking layer 130a is patterned to form a plurality of first openings 132a (only one opening is shown) that exposes the under-ball-metallurgy layer 120. Since the first masking layer 130a is made using photoresist material, the first masking layer 130 is patterned to form a plurality of openings 132a through photo-exposure and subsequent chemical development.

Figure 1D:
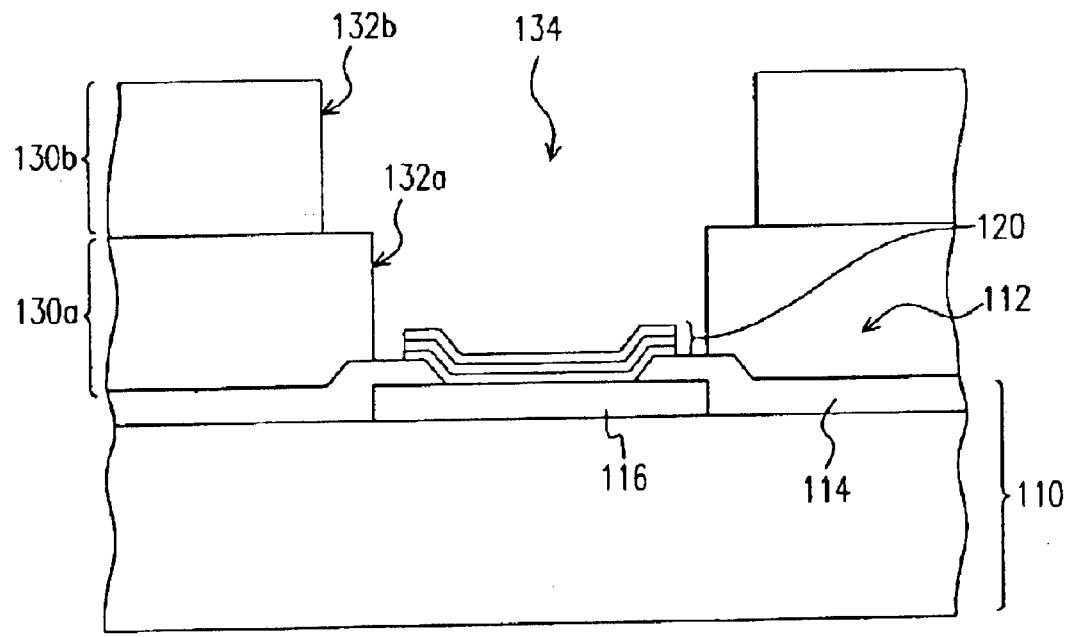

As shown in FIG. 1D, a second masking layer 130b is formed over the first masking layer 130a. The second masking layer 130b may be fabricated using the same type of photoresist material such as photosensitive dry film as in the first masking layer 130a. Note that spin-coating liquid photoresist over the first masking layer 130a to form the second masking layer 130b is likely to fill up the first openings 132a. Hence, a dry photosensitive film is usually pressed on the first masking layer 130a in a lamination process to form the second masking layer 130b. Similarly, a plurality of second openings 132b are formed in the second masking layer 130b through photo-exposure and development processes. The second openings 132b are formed on top of the respective first openings 132a such that the underlying under-ball-metallurgy layer 120 is similarly exposed.

Figure 1E:
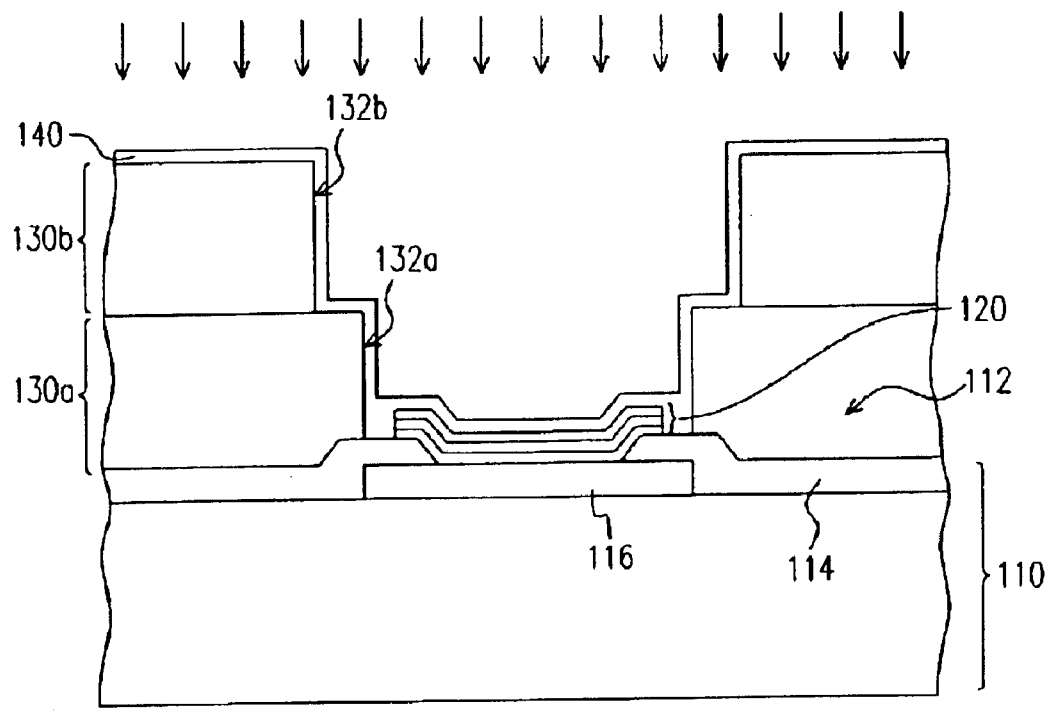

As shown in FIG. 1E, a flux film 140 is formed over the active surface 112 of the wafer 110. The flux film 140 is formed, for example, by spraying flux material on the active surface 112. Note that at least a portion of the flux material must cover the upper surface of the under-ball-metallurgy layer 120. The purpose of depositing flux material over the under-ball-metallurgy layer 120 is to increase the bonding strength between the under-ball-metallurgy layer 120 and a solder ball 150 in a subsequent step shown in 1F. Note also that the flux material may contain some volatile substance such as alcohol. Thus, the surface of the flux film 140 is often rendered non-adhesive after the volatile substance evaporates.

Figure 1F:
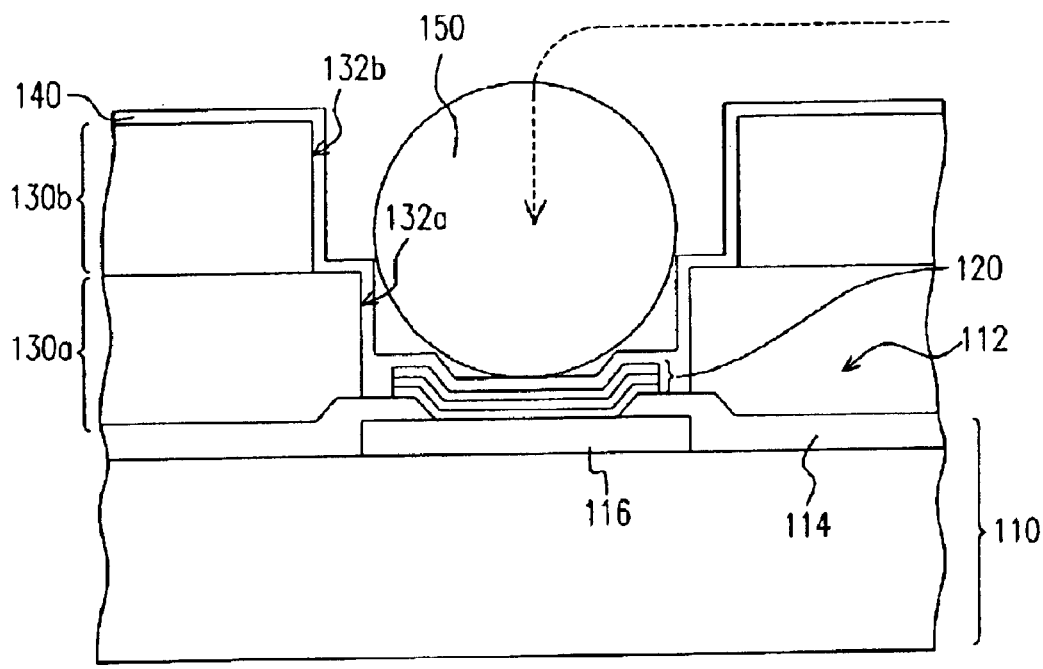

As shown in FIG. 1F, a large number of solder balls 150 each having a diameter between about 150 to 300 $\mu$m are placed on the second masking layer 130b. The solder balls 150 are set into mild horizontal motion over the second masking layer 130b by rocking the wafer 110 gently or pushing the solder balls 150 using a scrapper or a roller. Through gravity alone, a solder ball 150 is dropped into each second opening 132b and first opening 132a pair. That is, a solder ball 150 is dropped into a step opening structure 134 made up of the first masking layer 130a and the second masking layer 130b such that the lower end of the solder ball 150 is in contact with the upper surface of the under-ball-metallurgy layer 120.

Note that the first opening 132a must have an aperture comparable to the diameter of the solder ball 150 for positioning the solder ball 150 right inside the first opening 132a. For example, if the first masking layer 130a has a thickness greater than the diameter of the solder ball 150, the first opening 132a must have an aperture, such as a diameter greater than or equal to the diameter of the solder ball 150. Therefore, the inner sidewall of the first opening 132a may contact the surface of the solder ball 150 and hence accurately position the solder ball 150. On the other hand, if the first masking layer 130a has a thickness smaller than the diameter of the solder ball 150, the first opening 132a may have a diameter smaller than the diameter of the solder ball 150. In this case, the upper edge region of the first opening 132a is able to contact the surface of the solder ball and hence accurately position the solder ball 150.

When the diameter of the second opening 132b is slightly larger than the diameter of the solder ball 150, the probability of getting the solder ball 150 into the second opening 132b is increased and the time required to position the solder ball 150 is shortened. Note that diameter of the second opening 132b must not be too large because two or more solder balls 150 may end up inside the second opening 132b above the first opening 132a.

Figure 1G:
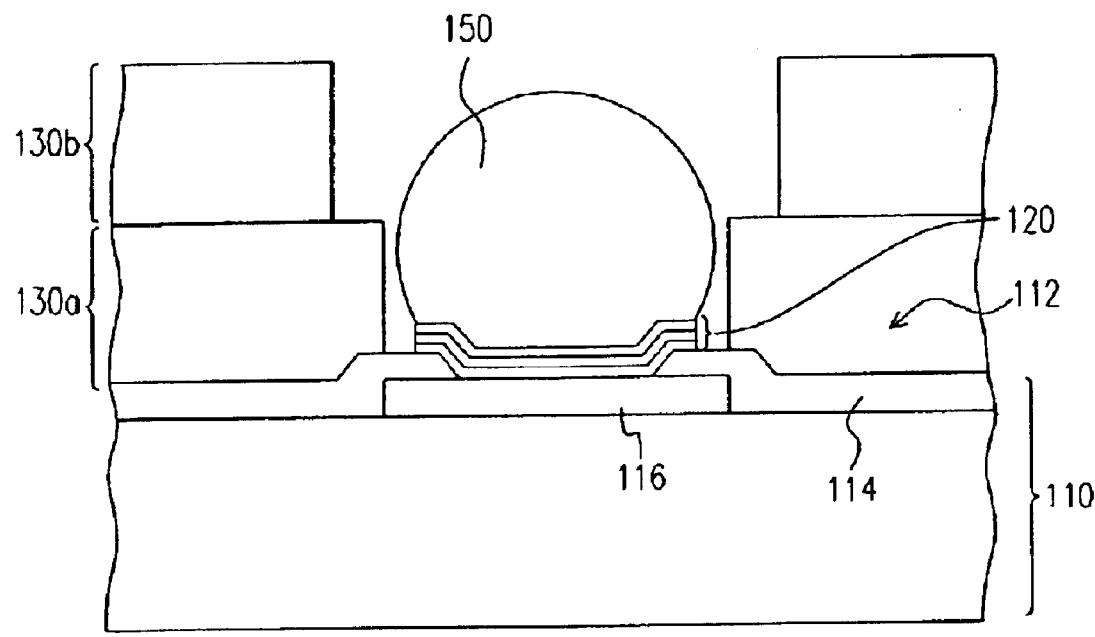
Figure 1H:
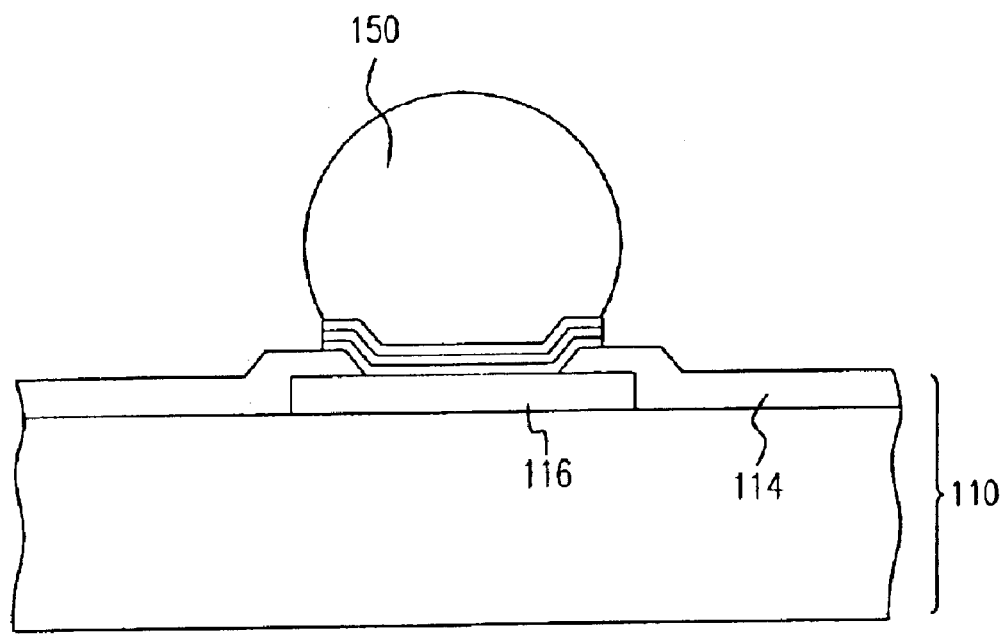

As shown in FIG. 1G, a reflow process is carried out to melt and join the solder ball 150 to the under-ball-metallurgy layer 120 after the solder ball 150 is stationed on the under-ball-metallurgy layer 120 within the first opening 132a and the second opening 132b. Finally, the first masking layer 130a and the second masking layer 130b are removed and any residual flux film 140 (as shown in FIG. 1F) are cleared so that the solder ball 150 is exposed above the active surface 112 of the wafer 110 as shown in FIG. 1H.

As shown in FIG. 1F, to increase the bonding strength between the solder ball 150 and the under-ball-metallurgy layer 120 after the reflow process, the flux material may be fabricated into solid particles and mixed with material inside the solder ball 150. Since the solder ball 150 now contains sufficient flux material to form a good bond with the under-ball-metallurgy layer 120, the steps for forming the flux film 140 as shown in FIG. 1E may be eliminated.

Figure 2:
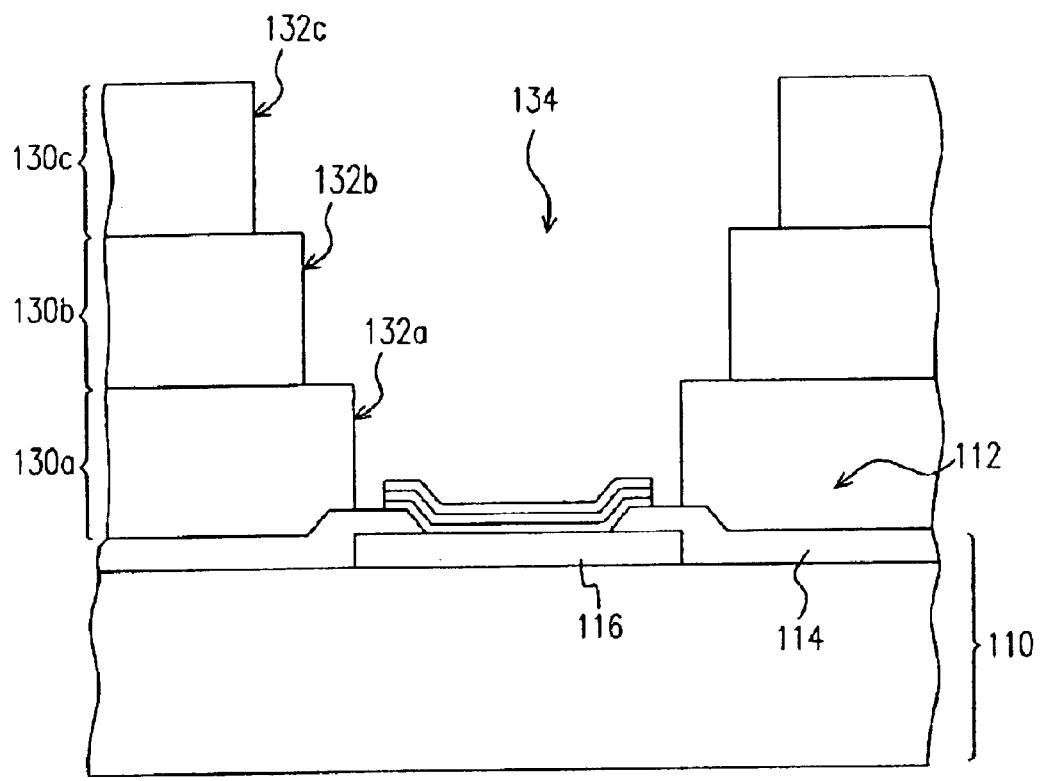
FIG. 2 is a cross-sectional view showing an additional masking layer over the second masking layer shown in FIG. 1D.

FIG. 2 is a cross-sectional view showing an additional masking layer over the second masking layer shown in FIG. 1D. As shown in FIG. 1D, the number of masking layers on the active surface 112 of the wafer 110 is not limited to the first masking layer 130a and the second masking layer 130b. The steps for forming the second masking layer 130b may be repeated to form a third masking layer 130c over the second masking layer 130b. The third masking layer 130c is similarly patterned to form a plurality of third openings 132c so that the first masking layer 130a, the second masking layer 130b and the third masking layer 132c together form a step opening structure 134. This step opening structure 134 further enhances the capacity to position a solder ball onto the under-ball-metallurgy layer 120.

Figure 3:
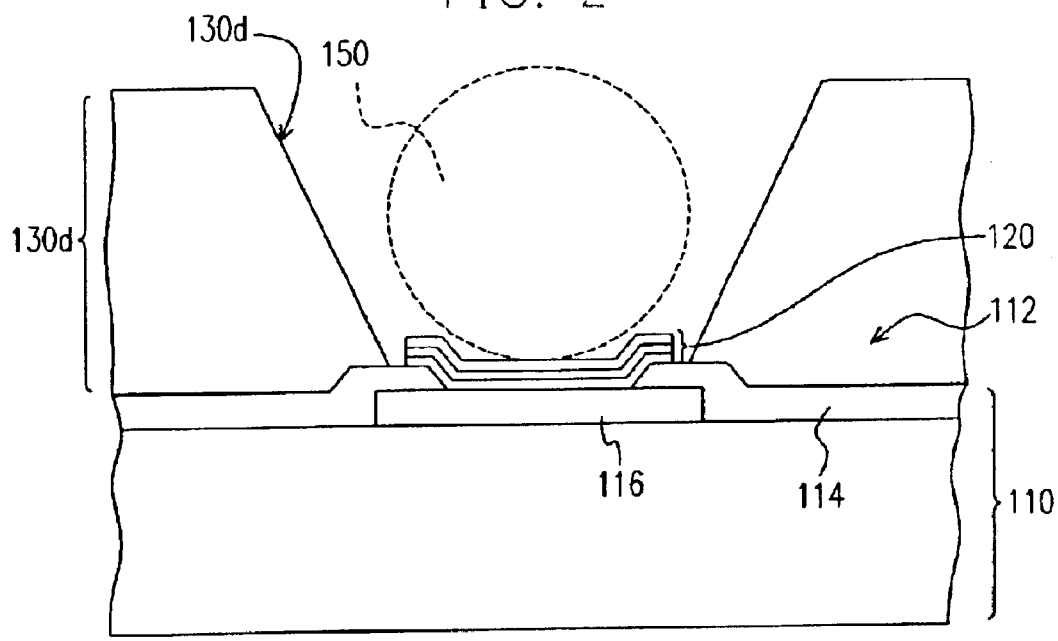
FIG. 3 is a cross-sectional view showing another type of masking layer replacing the first and the second masking layer shown in FIG. 1D.

FIG. 3 is a cross-sectional view showing another type of masking layer replacing the first and the second masking layer shown in FIG. 1D. The step opening structure 134 derived from the combination of the first masking layer 130a and the second masking layer 130b as shown in FIG. 1D may be replaced by an opening structure as shown in FIG. 3. To form the sloping side opening as shown in FIG. 3, a thick photosensitive fourth masking layer 130d is formed over the active surface 112 of the wafer 110. The fourth masking layer is fabricated using a photoresist material such as photosensitive dry film or liquid photoresist. Photo-exposure and development processes are carried out to form a plurality of openings 132d in the fourth masking layer 130d. Note that the side edges of the fourth opening 132d in section are a pair of left-right symmetrical curves (or straight lines).

To form the left-right symmetrical curves on each side of a section through the fourth opening 132d, a defocusing photo-exposure is carried out such that the focus during exposure is set to the upper end of the fourth masking layer 130d. Since the photo-exposure beam is focused on the upper end of the fourth masking layer 130d, the upper end of the fourth opening 132d, or the side furthest from the under-ball-metallurgy layer 120, receives more light energy than the bottom end of the fourth opening 132d. Therefore, after performing a chemical development to remove the exposed fourth masking layer 130d, an opening 132d with left-right symmetrical side curves is formed. In other words, the upper end of the fourth opening 132d has a greater diameter than the bottom end of the fourth opening 132d.

Because the upper end of the fourth opening 132d has a greater diameter than the bottom end of the fourth opening 132d, the probability of a solder ball 150 dropping into the fourth opening 132d is increased. Moreover, the smaller diameter at the bottom end of the opening 132d also facilitates the rolling of the solder ball 150 down the sloping edge of the opening 132d and settling precisely on the under-ball-metallurgy layer 120. Thus, the fourth opening 132d has a function identical to the step opening structure formed by the first masking layer 130a and the second masking layer 130b as shown in FIG. 1D.

One major aspect of the solder ball attaching process according to this invention is the formation of an under-ball-metallurgy layer on the bonding pad of a wafer and the sequential formation of at least two patterned masking layers over the wafer thereafter. Hence, a solder ball on top of the masking layer may easily roll and gravitate into the step opening structure formed by the patterned masking layers and position on top of the under-ball-metallurgy layer. A subsequent reflow process attaches the solder ball firmly to the under-ball-metallurgy layer. Finally, the masking layers are removed to expose the solder ball. Since the diameter of the opening in the upper masking layer is larger than the diameter of the solder ball, the probability of the solder ball dropping into the opening is increased and the time for positioning the solder ball on the under-ball-metallurgy layer is shortened. In addition, the upper edge of the opening in the lower masking layer having a diameter comparable to the diameter of the solder ball also facilitates the positioning of the solder ball.

Furthermore, this invention also provides a solder ball attaching process that utilizes a thick photosensitive masking layer to replace a conventional composite masking layer containing a multiple of patterned masking layers. Photo-exposure and development processes are carried out to form a plurality of openings. Through defocusing exposure, each opening in the masking layer has left-right symmetrical sidewall curves (or straight lines) such that the opening diameter near the upper end is larger than the opening diameter near the lower end. The larger opening diameter near the top of the masking layer increases the probability of a solder ball dropping into the opening and the smaller opening diameter near the bottom of the masking layer facilitates the positioning of the solder ball. Hence, the solder ball can be accurately positioned on the under-ball-metallurgy layer.

In conclusion, the solder ball attaching process according to this invention has the following advantages:

1. The solder ball attaching process uses photoresist material such as photosensitive dry film or liquid photoresist to form the masking layer. A plurality of openings each capable of accommodating a solder ball is formed in the masking layer by photo-exposure and development processes. Thus, compared with the conventional vacuum transfer and gravity transfer through stencil, the process according to this invention requires the least cost to position the solder balls.

2. It does not matter if the multiple masking layers method for forming a step opening structure or a single masking layer method for forming an opening with larger opening diameter at the top is used. The probability of the solder ball dropping into the opening is increased and positioning time is shortened because all openings have a diameter larger than the solder ball near the top of the opening in the masking layer. In addition, the solder ball is accurately positioned over the under-ball-metallurgy layer because all openings have a diameter smaller than the solder ball near the bottom of the opening in the masking layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A solder ball attaching process for attaching at least one solder ball onto a wafer having an active surface, a passivation layer and at least one bonding pad, wherein the passivation layer and the bonding pads are formed on the active surface of the wafer such that the passivation layer exposes the bonding pad, the solder ball attaching process comprising the steps of:

forming at least an under-ball-metallurgy layer over the bonding pad;

forming a first masking layer over the active surface of the wafer;

patterning the first masking layer to form a first opening, wherein the first opening exposes the under-ball-metallurgy layer;

forming a second masking layer over the first masking layer;

patterning the second masking layer to form at least one second opening, wherein the second opening is above the first opening exposing the under-ball-metallurgy layer and the second opening has a diameter greater than the diameter of the solder ball;

placing the solder ball on the second masking layer and rolling the solder ball so that the solder ball rolls drops into the second opening and the first opening, wherein the bottom surface of the solder ball is in contact with the upper surface of the under-ball-metallurgy layer;

conducting a reflow process so that the solder ball and the under-ball-metallurgy layer are bonded together; and removing the first masking layer and the second masking layer.

2. The process of claim 1, wherein the first masking layer is fabricated using photoresist material.

3. The process of claim 2, wherein the step of patterning the first masking layer includes performing photo-exposure and photoresist development processes.

4. The process of claim 2, wherein the first masking layer is fabricated using dry film.

5. The process of claim 4, wherein the step of forming a first masking layer over the active surface of the wafer includes conducting a lamination process.

6. The process of claim 2, wherein the first masking layer is fabricated using liquid photoresist.

7. The process of claim 6, wherein the step of forming a first masking layer over the active surface of the wafer includes conducting a spin-coating process.

8. The process of claim 1, wherein the second masking layer is fabricated using photoresist material.

9. The process of claim 8, wherein the step of patterning the second masking layer includes performing photo-exposure and photoresist development processes.

10. The process of claim 8, wherein the second masking layer is fabricated using dry film.

11. The process of claim 10, wherein the step of forming a second masking layer over the first masking layer includes conducting a lamination process.

12. The process of claim 1, wherein after the step of patterning the second masking layer but before placing the solder ball on the second masking layer, further includes forming a flux layer over the active surface of the water so that at least a portion of the flux layer covers the upper surface of the under-ball-metallurgy layer.

13. The process of claim 12, wherein the lower end of the solder ball is in contact with the under-ball-metallurgy layer through the flux layer.

14. The process of claim 12, wherein the step of forming a flux layer on the active surface of the wafer includes spraying flux material over the active surface.

15. The process of claim 1, wherein solid particles of flux material are enclosed within the solder ball.

16. A solder ball attaching process for attaching at least a solder ball to a wafer having an active surface, a passivation layer and at least one bonding pad, wherein the passivation layer and the bonding pad are formed on the active surface of the wafer such that the passivation layer exposes the bonding pad, the solder ball attaching process comprising the steps of:

(a) forming at least an under-ball-metallurgy layer over the bonding pad;

(b) forming a first masking layer over the active surface of the wafer;

(c) patterning the first masking layer to form a first opening, wherein the first opening exposes the under-ball-metallurgy layer;

(d) forming a second masking layer over the first masking layer;

(e) patterning the second masking layer to form at least one second opening, wherein the second opening is above the first opening exposing the under-ball-metallurgy layer and the second opening has a diameter greater than the diameter of the solder ball;

(f) repeating the operations from step (d) to step (e) one or more times so that the first masking layer together with the group of second masking layers together constitute at least one step opening structure over the active surface of the wafer, wherein the diameter at the upper end of the step opening structure is greater than the diameter of the solder ball;

(g) placing the solder ball on the second masking layer furthest from the under-ball-metallurgy layer and rolling the solder ball so that the solder ball drops into the step opening structure, wherein the bottom surface of the solder ball is in contact with the upper surface of the under-ball-metallurgy layer;

(h) conducting a reflow process so that the solder ball and the under-ball-metallurgy layer are bonded together; and (i) removing the first masking layer and the group of second masking layers.

17. The process of claim 16, wherein the first masking layer is fabricated using photoresist material.

18. The process of claim 16, wherein the first masking layer is fabricated using dry film.

19. The process of claim 16, wherein the first masking layer is fabricated using liquid photoresist.

20. The process of claim 16, wherein the group of second masking layers is fabricated using photoresist material.

21. The process of claim 20, wherein the second masking layers are fabricated using dry film.

22. The process of claim 16, after the step of patterning the second masking layers but before placing the solder ball on the second masking layer, further including forming a flux layer over the active surface of the water, so that at least a portion of the flux layer covers the upper surface of the under-ball-metallurgy layer.

23. The process of claim 22, wherein the lower end of the solder ball is in contact with the under-ball-metallurgy layer through the flux layer.

24. The process of claim 22, wherein the step of forming a flux layer on the active surface of the wafer includes spraying flux material over the active surface.

25. A solder ball attaching process for attaching at least one solder ball onto a wafer having an active surface, a passivation layer and at least one bonding pad, wherein the passivation layer and the bonding pads are formed on the active surface of the wafer such that the passivation layer exposes the bonding pad, the solder ball attaching process comprising the steps of:

forming at least an under-ball-metallurgy layer over the bonding pad;

forming a masking layer over the active surface of the wafer;

patterning the masking layer to form an opening that exposes the under-ball-metallurgy layer, wherein an aperture of the opening furthest from the under-ball-metallurgy layer is greater than the diameter of the solder ball and the aperture of the opening furthest from the under-ball-metallurgy layer is greater than an aperture of the opening closest to the under-ball-metallurgy layer;

placing the solder ball on the masking layer and rolling the solder ball so that the solder ball drops into the opening, wherein the bottom surface of the solder ball is in contact with the upper surface of the under-ball-metallurgy layer;

conducting a reflow process so that the solder ball and the under-ball-metallurgy layer are bonded together; and removing the masking layer.

26. The process of claim 25, wherein the opening in the masking layer has a sectional profile that includes a pair of left-right symmetrical curves or straight lines.

27. The process of claim 25, wherein the masking layer is fabricated using photoresist material.

28. The process of claim 25, wherein after the step of patterning the masking layer but before placing the solder ball on the masking layer, further includes forming a flux layer over the active surface of the water so that at least a portion of the flux layer covers the upper surface of the under-ball-metallurgy layer.

29. The process of claim 25, wherein solid particles of flux material are enclosed within the solder ball.

* * * * *